United States Patent
Clevenger et al.

(10) Patent No.: US 10,325,778 B2
(45) Date of Patent: Jun. 18, 2019

(54) UTILIZING MULTIPLE LAYERS TO INCREASE SPATIAL FREQUENCY

(71) Applicant: International Business Machines Corporation, Armonk, NY (US)

(72) Inventors: Lawrence A. Clevenger, Dutchess, NY (US); John H. Zhang, Albany, NY (US); Carl Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/801,039

(22) Filed: Nov. 1, 2017

(65) Prior Publication Data

US 2019/0067024 A1 Feb. 28, 2019

Related U.S. Application Data

(63) Continuation of application No. 15/690,540, filed on Aug. 30, 2017.

(51) Int. Cl.
*H01L 21/302* (2006.01)
*H01L 21/308* (2006.01)
*H01L 21/02* (2006.01)
*H01L 21/311* (2006.01)
*H01L 21/768* (2006.01)

(52) U.S. Cl.
CPC ...... *H01L 21/3088* (2013.01); *H01L 21/3081* (2013.01); *H01L 21/3086* (2013.01); *H01L 21/0217* (2013.01); *H01L 21/0228* (2013.01); *H01L 21/02164* (2013.01); *H01L 21/31116* (2013.01); *H01L 21/76816* (2013.01)

(58) Field of Classification Search
CPC ............ H01L 21/0337; H01L 21/3086; H01L 21/3088; H01L 21/308; H01L 21/32139
USPC .......................... 438/716, 717, 736
See application file for complete search history.

(56) References Cited

U.S. PATENT DOCUMENTS

| | | |
|---|---|---|
| 7,301,210 B2 | 11/2007 | Abadeer et al. |
| 8,105,901 B2 | 1/2012 | Cheng et al. |
| 8,525,235 B2 | 9/2013 | Cheng et al. |
| 8,623,770 B1 | 1/2014 | Gao et al. |
| 8,669,186 B2 | 3/2014 | LiCausi |

(Continued)

OTHER PUBLICATIONS

Clevenger, et al. "Utilizing Multiple Layers to Increase Spatial Frequency," U.S. Appl. No. 15/690,540, filed Aug. 30, 2017.

(Continued)

*Primary Examiner* — Hsien Ming Lee
(74) *Attorney, Agent, or Firm* — Nathan M. Rau

(57) ABSTRACT

A chemical material is deposited on a surface of a substrate. A mandrel composition is deposited on a surface of the chemical material. A mandrel hard mask pattern is deposited on a surface of the mandrel composition. The mandrel composition is etched. The mandrel hard mask pattern is removed. A plurality of spacer materials are deposited sequentially onto a surface of the chemical material and a surface of the mandrel composition. A portion of each of the plurality of spacer materials are removed sequentially. A remainder of the mandrel composition is removed. The substrate is etched. The chemical material and at least one of the spacer materials of the plurality of spacer materials are removed.

7 Claims, 11 Drawing Sheets

(56) References Cited

U.S. PATENT DOCUMENTS

| | | |
|---|---|---|
| 8,828,876 B2 | 9/2014 | Horak et al. |
| 9,040,371 B2 | 5/2015 | Cheng et al. |
| 9,287,135 B1 | 3/2016 | Doris et al. |
| 9,831,099 B2 * | 11/2017 | O'Meara ........... H01L 21/02123 438/716 |
| 2015/0303067 A1 * | 10/2015 | Liu ................... H01L 21/0337 438/703 |
| 2015/0318181 A1 * | 11/2015 | Cantone .......... H01L 21/823431 438/702 |
| 2016/0005596 A1 | 1/2016 | Behera et al. |
| 2016/0240629 A1 | 8/2016 | Liou et al. |

OTHER PUBLICATIONS

List of IBM Patents or Patent Applications Treated as Related, U.S. Appl. No. 15/690,540, filed Aug. 30, 2017, 2 pgs.

Natori et al., "Innovative solutions on 193 immersion-based self-aligned multiple patterning," Advances in Patterning Materials and Processes XXXI, Proceedings of SPIE vol. 9051, pp. 90511E-1-90511E-6. DOI: 10.1117/12.2046220.

* cited by examiner

UTILIZING MULTIPLE LAYERS TO INCREASE SPATIAL FREQUENCY

BACKGROUND

The present invention relates generally to the field of semiconductor device manufacturing, and more particularly to chemical etching.

Chemical etching is a type of application utilized to manufacture semiconductors that produce a desired shape, such as an electrical via. The desired shape may be produced, in part, by masking a substrate with a chemical composition then demasking the substrate. Masking is the process of applying the maskant material to the surface to ensure that only desired areas are etched. The maskant to be used is determined primarily by the chemical used to etch the material and the material itself. Demasking is the combined process of clearing the part of etchant and maskant.

SUMMARY

Embodiments of the present invention disclose a method of manufacturing and a product by process for increasing spatial frequency of pitch widths. A chemical material is deposited on a surface of a substrate. A mandrel composition is deposited on a surface of the chemical material. A mandrel hard mask pattern is deposited on a surface of the mandrel composition. The mandrel composition is etched. The mandrel hard mask pattern is removed. A plurality of spacer materials are deposited sequentially onto a surface of the chemical material and a surface of the mandrel composition. A portion of each of the plurality of spacer materials are removed sequentially. A remainder of the mandrel composition is removed. The substrate is etched. The chemical material and at least one of the spacer materials of the plurality of spacer materials are removed.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Pitch split is a distance between adjacent pitches in an integrated circuit. The pitch split may be critical for lithography patterning of advanced nodes technology. As the pitch split decreases, the availability of space increases, thereby increasing complexity capability of an integrated circuit; the denser the integrated circuit, the higher an amount of computation may be performed by the integrated circuit. Conventional sidewall entrench, sidewall image transfer, or extreme ultraviolet lithography techniques typically require a high manufacturing cost due to high instrumentation cost, and are typically extremely time consuming. Additionally, the aforementioned techniques are limited to a minimum pitch width. For example, extreme ultraviolet lithography is limited by the amplitude of a wavelength of the ultraviolet light emitted onto a substrate.

Therefore, it may be advantageous to produce pitches that are closer together at a reduced cost while implementing simplified methods. Embodiments of the present invention relate to a method of manufacturing and structure for forming variable pitch split patterning with an increased frequency per unit of material. Embodiments of the present invention may be accomplished by adding multiple spacer materials to a substrate when making an integrated circuit and etching the multiple spacer materials with selective reactive ion etching that etches particular spacer materials. The total amount of variable pitches may be determined by the formula $C(N,m)=N!/(m!(N-m)!)$, where m is the number of spacers with different materials, N is the total number of spacers. The total number of variable pitches in a particular amount of space can increase if a selective mandrel composition and a spacer gap etch are added.

It is to be understood that the aforementioned advantages are example advantages and should not be construed as limiting. Embodiments of the present disclosure can contain all, some, or none of the aforementioned advantages while remaining within the spirit and scope of the present disclosure. The materials or substrates mentioned in the disclosure may be any quantity and the figures are not drawn to any scale.

Figure 1A:
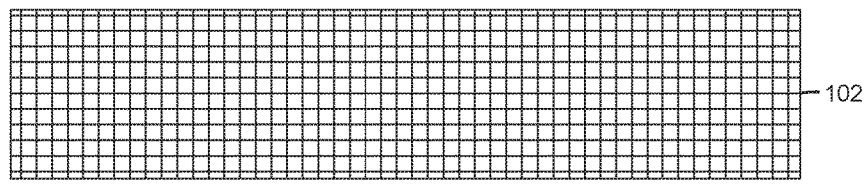
FIGS. 1A-1C illustrate a process for depositing a mandrel composition onto a substrate, in accordance with embodiments of the present disclosure.
Figure 1B:
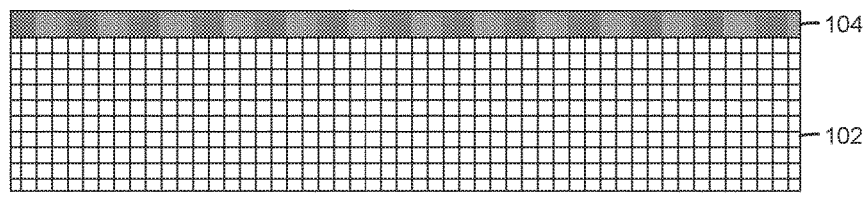
Figure 1C:
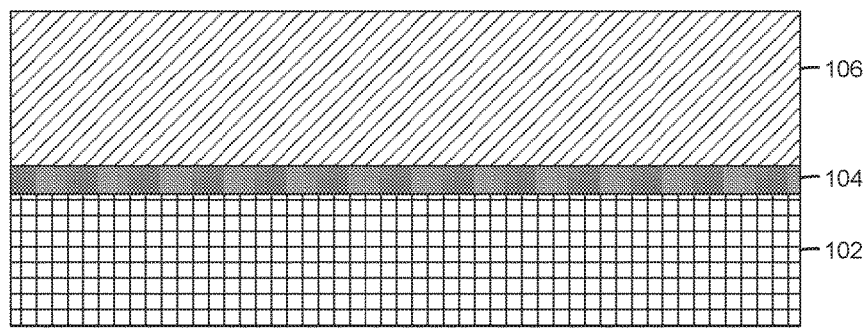

FIGS. 1A-C illustrate a mandrel composition 106 being deposited onto a substrate 102, in accordance with embodiments of the present disclosure. FIG. 1A illustrates a substrate 102 that may be any suitable integrated circuit substrate. For example, the substrate 102 may be a conductor, semiconductor, silicon, insulator, dielectric insulator films, or any type of material capable of carrying electrical signals.

As shown in FIG. 1B, a first chemical material 104 may be deposited onto the substrate 102. The first chemical material 104 may be deposited onto the substrate 102 using any appropriate technique, such as, for example, hard masking. The first chemical material 104 may cover the entire top surface (or a portion thereof) of the substrate 102. The first chemical material 104 may be any suitable chemical material. For example, the first chemical material 104 may be titanium nitride, or any other chemical material capable of being hard masked onto the substrate 102. In some embodiments, the first chemical material 104 may be selected based on, for example, the substrate 102 material, the mandrel composition 106, and/or the method for depositing the chemical material 104 onto the substrate 102.

As shown in FIG. 1C, the mandrel composition 106 may be layered on top of the first chemical material 104. The mandrel composition 106 may cover the entire top surface of the first chemical material 104. Alternatively, the mandrel composition 106 may only cover a portion of the first chemical material 104. The mandrel composition 106 may be layered onto the first chemical material 104 using any appropriate technique. The mandrel composition 106 may be any suitable material. For example, the mandrel composition 106 may be an amorphous silicon.

Figure 2A:
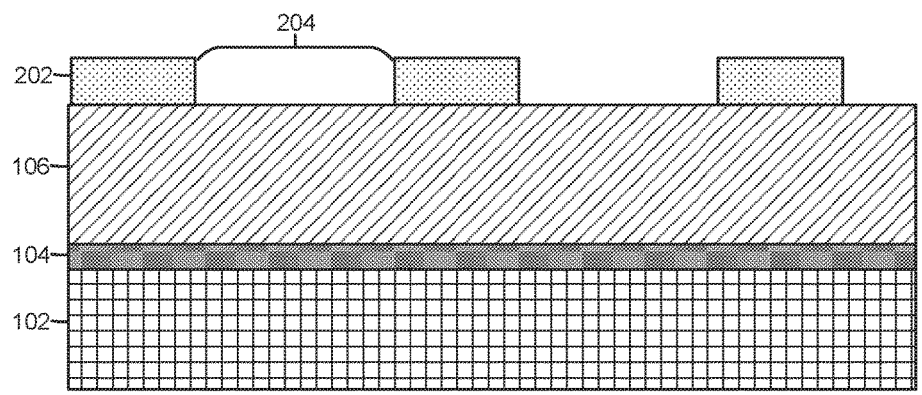
FIGS. 2A-2C illustrate a process for depositing a mandrel hard mask pattern on the mandrel composition, in accordance with embodiments of the present disclosure.
Figure 2B:
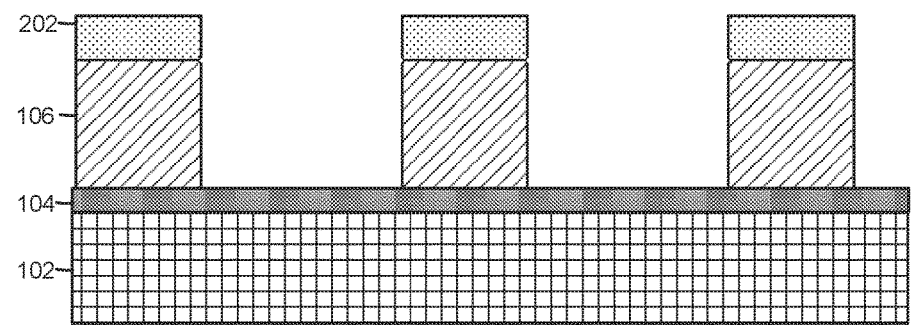
Figure 2C:
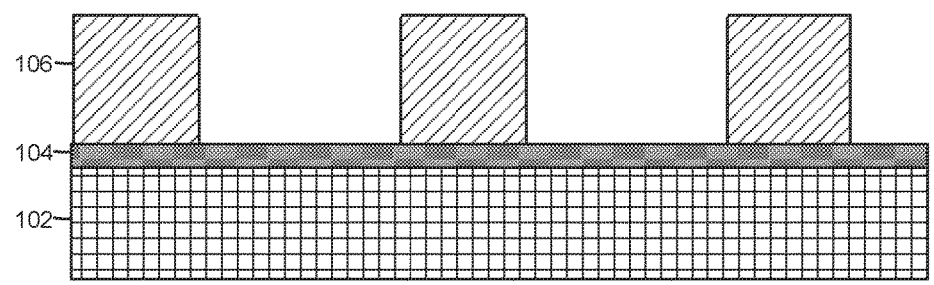

FIGS. 2A-2C illustrate a mandrel hard mask 202 being deposited on the mandrel composition and an etching process that removes a portion of the mandrel composition 106, in accordance with embodiments of the present disclosure. As shown in FIG. 2A, a mandrel hard mask 202 may be deposited in a pattern (spaced substantially equidistant or at variable lengths) on a surface of the mandrel composition 106. The distance 204 between adjacent mandrel hard masks (or portions of a hard mask) 202 may be the length of a lithography-limited pitch (e.g., approximately 130 nanometers for ultraviolet light), or any distance needed to achieve a desired distance between adjacent pitches. The mandrel hard mask 202 can be made out of any suitable material. For example, in some embodiments the mandrel hard mask 202 may be made out of silicon nitride.

As shown in FIG. 2B, a process of reactive ion etching may be done in order to remove a portion of the mandrel composition 106. In some embodiments, the reactive ion etching may be accomplished by spraying or pouring a chemical that reacts with the mandrel composition while not removing a substantial portion of the mandrel hard mask 202 or the first chemical material 104.

As shown in FIG. 2C, the mandrel hard mask 202 pattern may be stripped by applying and then removing dilute hydrofluoric acid. The dilute hydrofluoric acid may be selected so that no interference occurs with the amorphous silicon (e.g., the mandrel composition 106) and/or titanium nitride (e.g., the first chemical material 104). The mandrel hard masks 202 may also be removed by atomic layer disposition, which is a thin film deposition technique based on a sequential use of a gas phase chemical process. Two of more gases may be used in the atomic layer deposition. The type of gases may depend on the materials chosen for the mandrel composition 106 and the first chemical material 104.

Figure 3A:
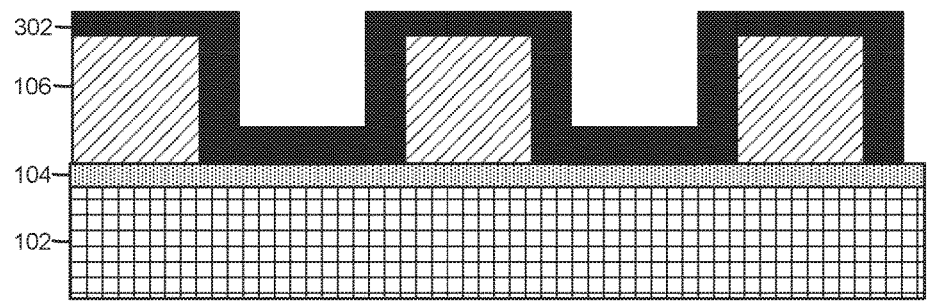
FIGS. 3A-3C illustrate a process for layering a first spacer material and a second spacer material on the initial substrate, in accordance with embodiments of the present disclosure.
Figure 3B:
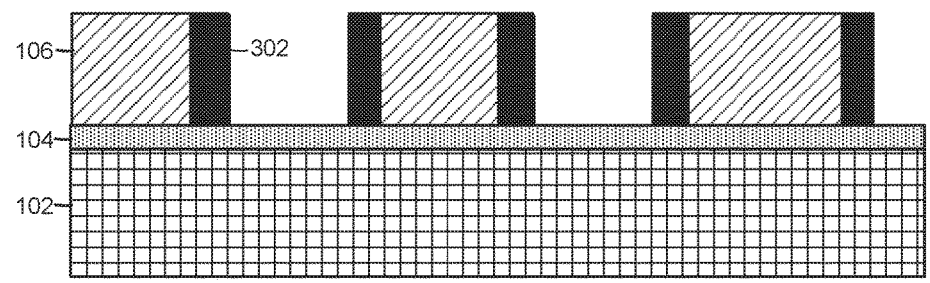
Figure 3C:
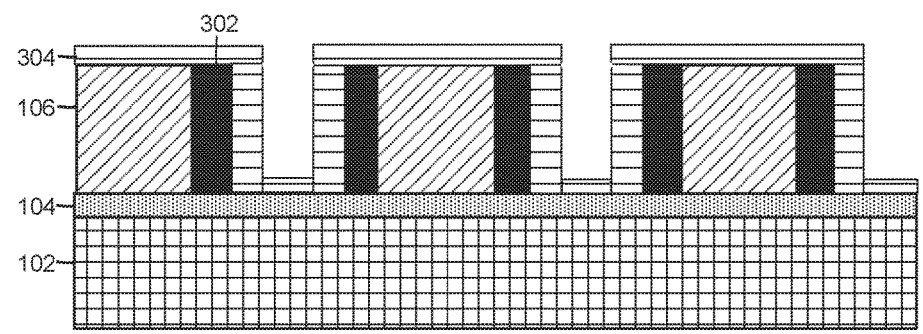

FIGS. 3A-3C illustrate an application and then etching process of a first spacer material 302 and an application of a second spacer material 304, in accordance with embodiments of the present disclosure. As shown in FIG. 3A, a first spacer material 302 may be deposited on the mandrel composition 106 and the first chemical material 104. The deposition of the first spacer material 302 may be to a top portion and sidewalls of the mandrel composition 106, and may be applied to some top portions (or any portion thereof) of the first chemical material 104. The first spacer material 302 may be any oxide, such as silicon dioxide, and the amount of the first spacer material used may be dependent on the quantity or chemical composition of the mandrel composition 106 and the first chemical material 104. The deposition technique performed may also be chemical vapor deposition. In some embodiments, the type of technique or chemicals used for deposition may depend on the desired thickness of the first spacer material or the desired pitch width.

As shown in FIG. 3B, a portion of the first spacer material 302 may be removed by performing reactive ion etching. The portion of the first spacer material 302 that was on a top portion of the mandrel composition 106 has been removed. Additionally, most of the first spacer material 302 between the portions of the mandrel composition 106 has been removed. The size, shape, and configuration of the remaining portions of the first spacer material 302 may be based on the desired properties of the etched substrate, such as the desired pitch width(s) and pitch thickness(es).

As shown in FIG. 3C, a second spacer material 304 may be deposited on the mandrel composition 106, the first chemical material 104, and a remaining portion of the first spacer material 302. The second spacer material 304 may be any silicon nitride and the quantity used may depend on the desired pitch width, and/or the type of chemicals used for the first chemical material 104, the mandrel composition 106, and/or the first spacer material 302. The deposition technique performed to deposit the second spacer material 304 may be chemical vapor deposition. In some embodiments, the type of technique or chemicals used for deposition may depend on the desired thickness of the second spacer material 304 or the desired pitch width.

Figure 4A:
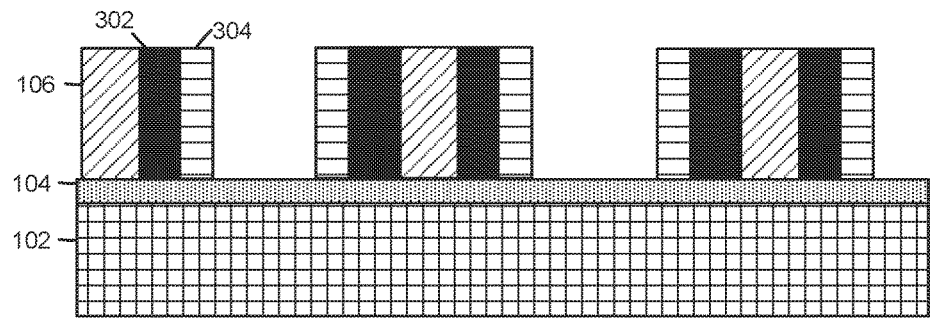
FIGS. 4A-4C illustrate a process for etching the second spacer material and adding a second layer of the first spacer material to the initial substrate, in accordance with embodiments of the present disclosure.
Figure 4B:
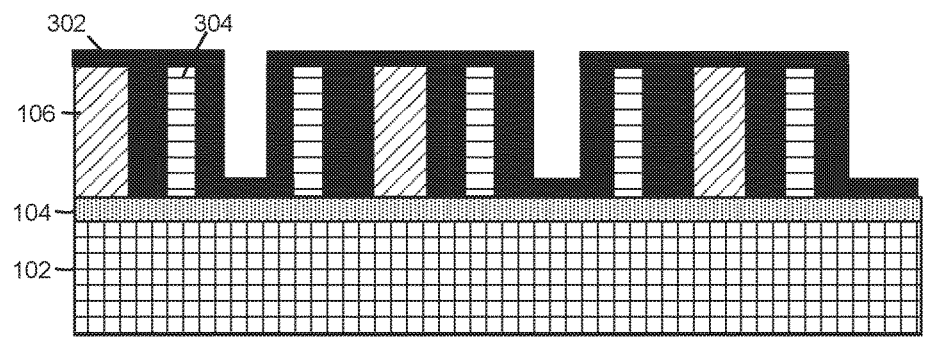
Figure 4C:
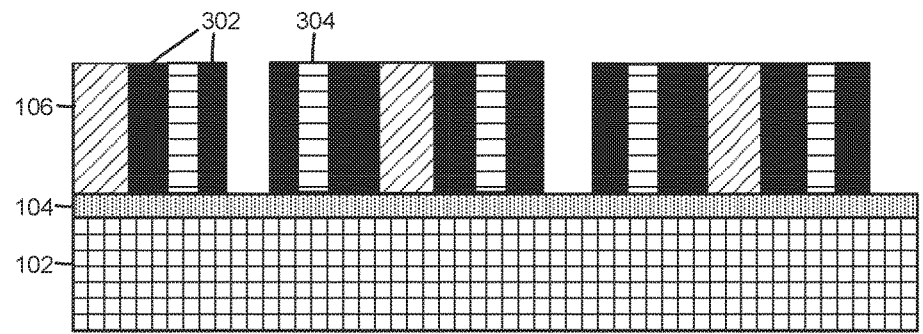

FIGS. 4A-4C illustrate an etching process of the second spacer material 304 and an application, and then subsequent etching, of a second application of first spacer material 302, in accordance with embodiments of the present disclosure. As shown in FIG. 4A, a portion of the second spacer material 304 may be removed by reactive ion etching. The reactive ion etching process may be substantially similar to the reactive ion etching being performed to remove the first spacer material 302, with reference to FIG. 3B. In some embodiments, the reactive ion etching may be accomplished by spraying or pouring a chemical that reacts with the second spacer material 304 while not removing a substantial portion of the mandrel composition 106, the first chemical material 104, and/or the first spacer material 302.

As shown in FIG. 4B, a second coating of the first spacer material 302 may be deposited on the mandrel composition 106, the first chemical material 104, a remaining portion of the second spacer material 304, and a remaining portion of the first spacer material 302, and a remaining portion of the second spacer material 304. The second coating of the first spacer material 302 may be any oxide, such as silicon dioxide. The deposition technique performed may be chemical vapor deposition. In some embodiments, the type of technique or chemicals used for deposition may depend on the desired thickness of the first spacer material or the desired pitch width.

As shown in FIG. 4C, the second coating of the first spacer material 302 may be removed from a top portion of the mandrel composition, a top portion of the first coating of the first spacer material 302, a top portion of the second spacer material 304, and a top portion of the first chemical material 104. The portion of the second coating of the first spacer material 302 may have been removed by performing reactive ion etching. The portion of the second coating of the first spacer material 302 may also be removed by atomic layer disposition, which is a thin film deposition technique based on a sequential use of a gas phase chemical process. Two of more gases may be used in the atomic layer deposition. The type of gases may depend on the materials chosen for the mandrel composition 106, the first chemical material 104, the first spacer material 302, and/or the second spacer material 304.

Figure 5A:
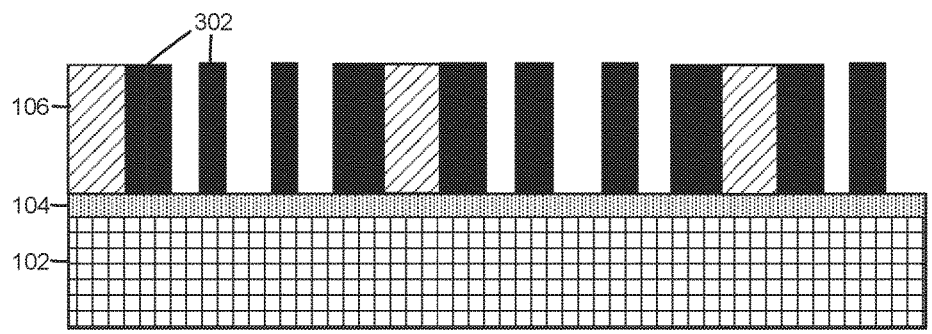
FIGS. 5A-5C illustrate a process for etching the initial substrate to generate a plurality of pitches, in accordance with embodiments of the present disclosure.
Figure 5B:
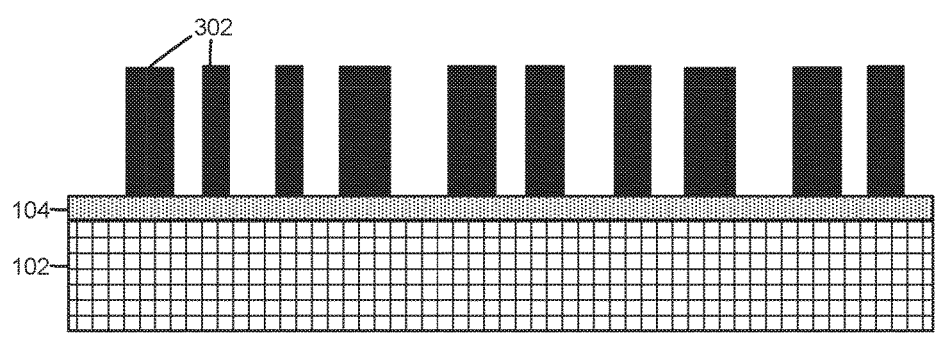
Figure 5C:
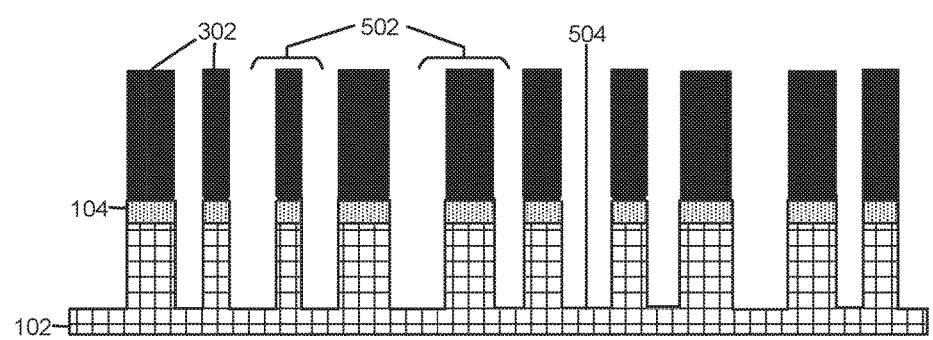

FIGS. 5A-5C illustrate the second spacer material 304 and a remaining portion of the mandrel composition 106 being removed, and the substrate 102 being etched, in accordance with embodiments of the present disclosure. As shown in FIG. 5A, the second spacer material 304 may be removed by performing reactive ion etching. In some embodiments, the second spacer material 304 may be removed by utilizing dilute hydrofluoric acid, or any wet chemistry technique. In some embodiments, the wet chemistry techniques may utilize chemicals that are selective to remove the second spacer material 304.

As shown in FIG. 5B, the mandrel composition 106 may be removed while leaving the first spacer material 302 by performing reactive ion etching. In some embodiments, the second spacer material 304 may be removed by utilizing dilute hydrofluoric acid, or any wet chemistry technique. In some embodiments, the wet chemistry techniques may utilize chemicals that are selective to remove the mandrel composition 106.

As shown in FIG. 5C, portions of the initial substrate 102 and the first chemical material 104 may be removed by reactive ion etching. In some embodiments, the initial substrate 102 and the first chemical material 104 may be removed by utilizing dilute hydrofluoric acid, or any wet chemistry technique. In some embodiments, the wet chemistry techniques may utilize chemicals that are selective to remove the initial substrate 102 and the first chemical material 104, while not substantially affecting the first spacer material 302. In other words, the chemicals used to etch the substrate 102 may be selected such that the first space material 302 acts as a photolithography mask.

In some embodiments, pitch widths 502 (e.g., the width of the pitch) may be the distance from a center of a channel 504 to the center of an adjacent channel. The pitch widths 502 may be uniform or variable depending on an amount of each type of spacer material used. For example, if the first and second coating of first spacer material 302 used are of differing amounts, then the pitch widths may be narrower than if a lower amount of the first and second coating of first spacer material 302 was used. Moreover, pitch widths 502 that were created by etching the initial substrate 102 may be five to ten angstroms, or wider. Each of the pitch widths 502 may be uniform and equidistant, or variable in length. For example, a first pitch width may be five angstroms, a second pitch width may be six angstroms, and a third pitch width may be seven angstroms, or any combination thereof. In some embodiments, the thickness of the remaining initial substrate 102 may be any desired length that depends on the quantity of first spacer material 302 being deposited and the quantity of the first spacer material 302 being etched.

Figure 6A:
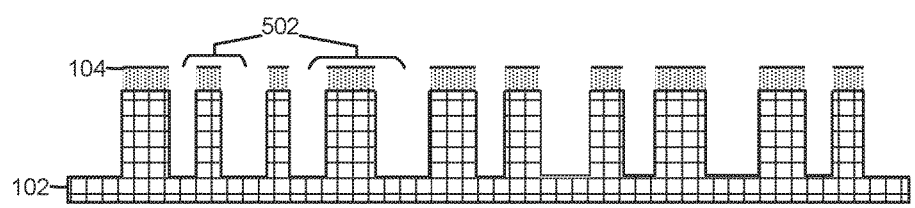
FIGS. 6A-6B illustrate a process for removing the chemical material from the etched substrate, in accordance with embodiments of the present disclosure.
Figure 6B:
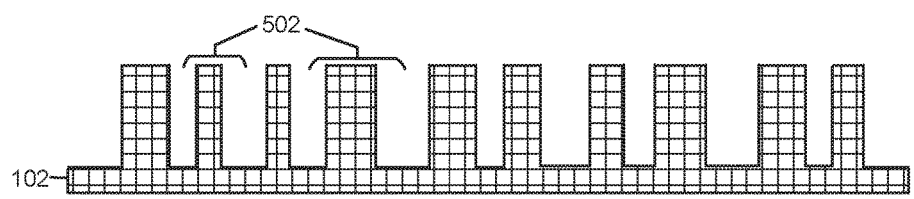

FIGS. 6A-6B illustrate the first chemical material 104 being removed from the initial substrate 102, in accordance with embodiments of the present disclosure. As shown in FIG. 6A, the first coating and the second coating of the first spacer material 302 may be removed. The first coating and second coating of the first spacer material 302 may have been removed by performing reactive ion etching, or by utilizing dilute hydrofluoric acid. In some embodiments, the first coating and second coating of the first spacer material 302 may be removed by any wet chemistry techniques that utilize chemicals known to remove the first and second coating of the first spacer material 302 without removing a substantial portion of the first chemical 104 or the initial substrate 102.

As shown in FIG. 6B, the first chemical material 104 being may be removed by performing reactive ion etching. In some embodiments, the first chemical material 104 may have been removed by utilizing dilute hydrofluoric acid, or any wet chemistry techniques that utilize chemicals that are selective to remove the first chemical material 104. In some embodiments, more than two spacer materials of differing or substantially the same quantity may be used. Doing so could create variable pitch widths. The total amount of variable pitches may be determined by the formula $C(N,m)=N!/(m!(N-m)!)$, where m is the number of spacers with different materials, N is the total number of spacers. The total can increase if a particular mandrel composition and a spacer gap etch are added.

Figure 7A:
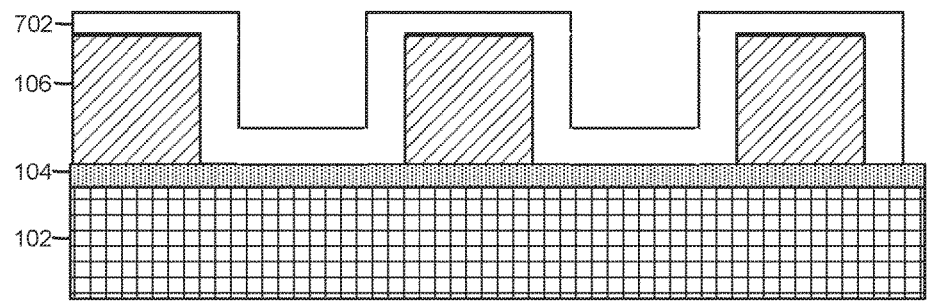
FIGS. 7A-7C illustrate a process for depositing a first spacer material and a second spacer material on the mandrel composition, in accordance with embodiments of the present disclosure.
Figure 7B:
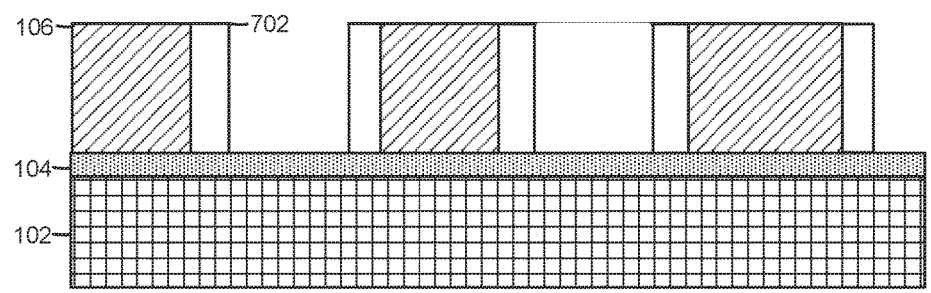
Figure 7C:
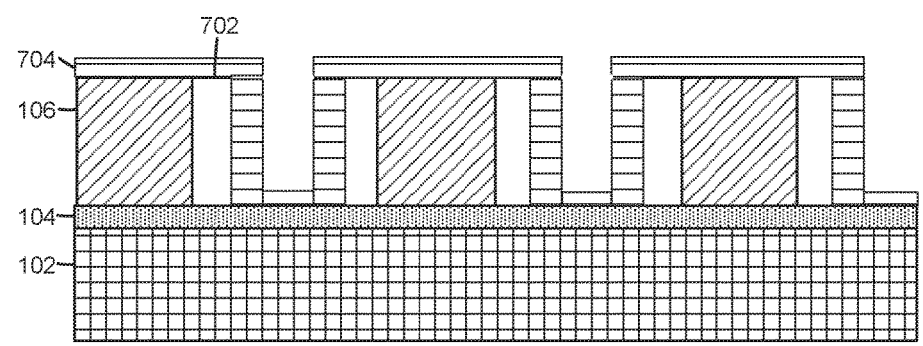

FIGS. 7A-7C illustrate a first spacer material 702 and a second spacer material 704 being deposited on a first chemical material 104 and a mandrel composition 106, in accordance with embodiments of the present disclosure. FIG. 7A may illustrate a next step in a process following FIG. 2C according to some embodiments. FIG. 7A illustrates a first spacer material 702 being deposited on a top portion and sidewalls of the mandrel composition 106 and a top portion of the first chemical material 104. The first spacer material 702 may be any oxide, such as silicon dioxide. The deposition technique performed may be chemical vapor deposition. In some embodiments, the type of technique or chemicals used for deposition may depend on the desired thickness of the first spacer material 702 or the desired pitch width.

As shown in FIG. 7B, the first spacer material 702 may be removed by reactive ion etching. The reactive ion etching may be targeted so that a substantial portion of the first spacer material is etched from a top portion of the mandrel composition 106 and a top portion of the first chemical material. In some embodiments, the reactive ion etching may be accomplished by spraying or pouring a chemical that reacts with the first spacer material 702 while not removing a substantial portion of the mandrel composition 106 and/or the first chemical material 104.

As shown in FIG. 7C, a second spacer material 704 may be deposited on the mandrel composition 106, the first chemical material 104, and a remaining portion of the first spacer mater 702. The second spacer material 704 may be any silicon nitride. The deposition technique of the second spacer material 704 performed may be chemical vapor deposition. In some embodiments, the type of technique or chemicals used for deposition may depend on the desired thickness of the first spacer material or the desired pitch width.

Figure 8A:
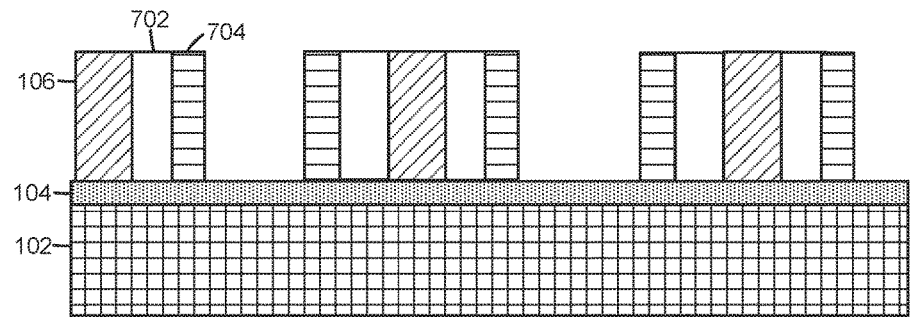
FIGS. 8A-8C illustrate a process for etching the second spacer material and depositing and etching a third spacer material on the mandrel composition, in accordance with embodiments of the present disclosure.
Figure 8B:
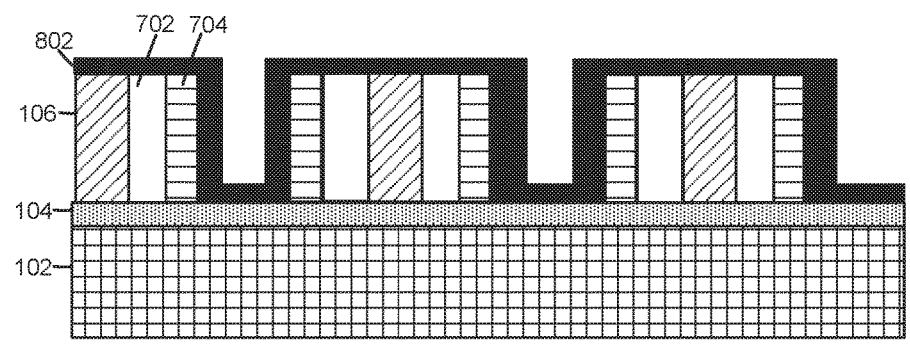
Figure 8C:
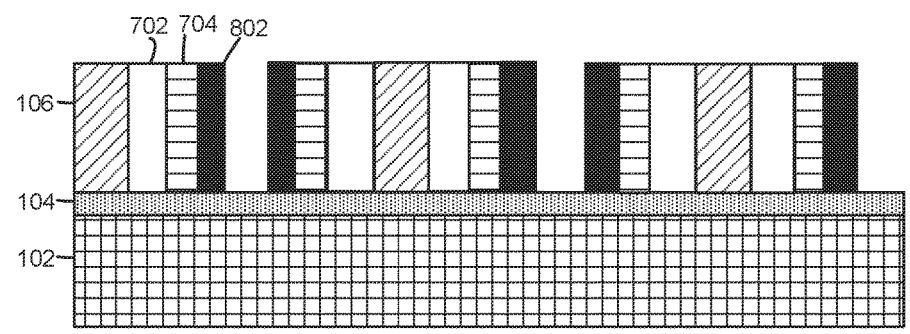

FIGS. 8A-8C illustrate a third spacer material 802 being deposited and then etched from a top portion of the mandrel composition 106, the first spacer material 702, the second spacer material 704, and the first chemical material 104, in accordance with embodiments of the present disclosure. As shown in FIG. 8A, a portion of the second spacer material 704 may be removed by reactive ion etching. In some embodiments, the reactive ion etching may be accomplished by spraying or pouring a chemical that reacts with the second spacer material 704 while not removing a substantial portion of the mandrel composition 106, the first chemical material 104, and/or the first spacer material 702. In some embodiments, the etching may be accomplished by utilizing dilute hydrofluoric acid, or any wet chemistry technique that utilizes chemicals that are selective to remove the second spacer material 704.

As shown in FIG. 8B, a third spacer material 802 may be deposited on the mandrel composition 106, the first chemical material 104, a remaining portion of the first spacer material 702, and a remaining portion of the second spacer material 704. The third spacer material 802 may be any oxide, such as silicon dioxide. The deposition technique performed may be chemical vapor deposition. In some embodiments, the type of technique or chemicals used for deposition may depend on the desired thickness of the third spacer material 802 or the desired pitch width.

As shown in FIG. 8C, a portion of the third spacer material 802 may be removed by performing reactive ion etching. The reactive ion etching may be targeted so that a substantial portion of the third spacer material 802 is etched from a top portion of the mandrel composition 106, a top portion of the first chemical material 104, and a top portion of both the first spacer material 702 and the second spacer material 704. In some embodiments, the reactive ion etching may be accomplished by spraying or pouring a chemical that reacts with the third spacer material 802 while not removing a substantial portion of the mandrel composition 106, a top portion of the first chemical material 104, and a top portion of both the first spacer material 702 and the second spacer material 704.

Figure 9A:
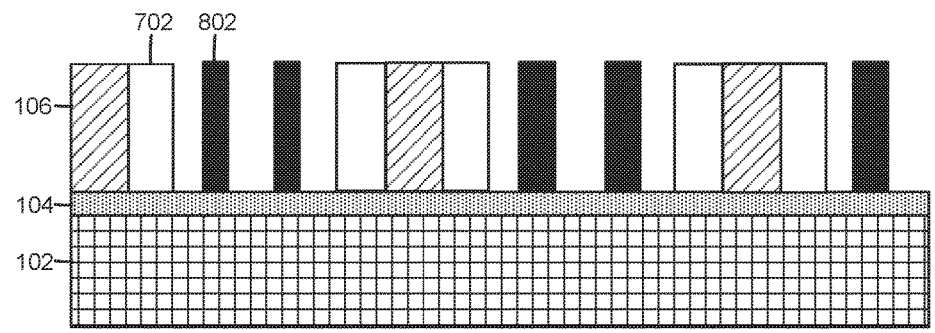
FIGS. 9A-9C illustrate a process for removing the mandrel composition and etching the substrate, in accordance with embodiments of the present disclosure.
Figure 9B:
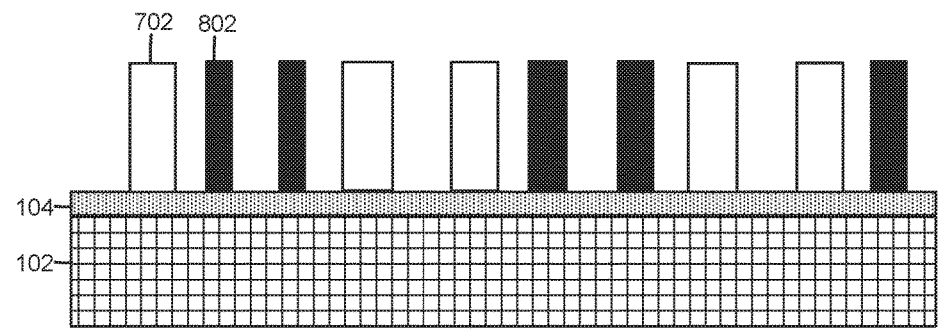
Figure 9C:
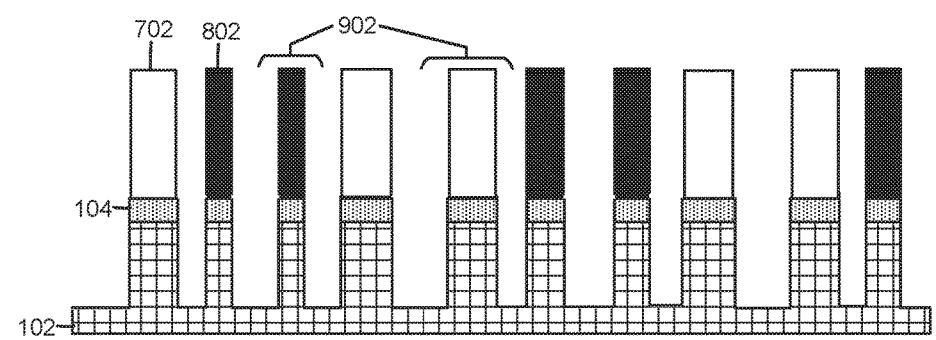

FIG. 9A-9C illustrate the second spacer material 704, the mandrel composition 106, the first chemical material 104, and the initial substrate 102 being etched, in accordance with embodiments of the present disclosure. As shown in FIG. 9A, the second spacer material 704 may be removed by performing reactive ion etching. In some embodiments, the second spacer material 704 may be etched by utilizing dilute hydrofluoric acid, or any wet chemistry technique that utilizes chemicals that are selective to remove the second spacer material 704. The reactive ion etching may be targeted so that all of the second spacer material 704 may be removed, or a substantial portion thereof is removed, while leaving the mandrel composition 106, the first spacer material 702, and/or the third spacer material 802. In some embodiments, the reactive ion etching may be accomplished by spraying or pouring a chemical that reacts with the second spacer material 704 while not removing a substantial portion of the mandrel composition 106, the first chemical material 104, the first spacer material 702, and the third spacer material 802.

As shown in FIG. 9B, the mandrel composition 106 may be removed by performing reactive ion etching. In some embodiments, the mandrel composition 106 may be etched by utilizing dilute hydrofluoric acid, or any wet chemistry technique that utilizes chemicals that are selective to remove the mandrel composition 106. The reactive ion etching may be targeted so that all of the mandrel composition 106 may be removed, or a substantial portion thereof, while leaving the first spacer material 702 and the third spacer material 802 without a substantial loss of material, or none at all. In some embodiments, the reactive ion etching may be accomplished by spraying or pouring a chemical that reacts with the second spacer material 704 while not removing a substantial portion of the first chemical material 104, the first spacer material 702, and the third spacer material 802.

As shown in FIG. 9C, portions of the initial substrate 102 may be removed by performing reactive ion etching. In some embodiments, the initial substrate 102 and the first chemical material 104 may be etched by utilizing dilute hydrofluoric acid, or any wet chemistry technique that utilizes chemicals that are selective to remove the initial substrate 102 and the first chemical material 104. The reactive ion etching may be targeted so that a significant portion of the initial substrate 102 and the first chemical material 104 that is not directly below either the first spacer material 702 or the third spacer material 802 may be removed while leaving the first spacer material 702 and the third spacer material 802 without much or any material loss. In some embodiments, the reactive ion etching may be accomplished by spraying or pouring a chemical that reacts with the initial substrate 102 and the first chemical material 104 while not removing a substantial portion of the first spacer material 702 and/or the third spacer material 802. Pitch widths 902 may be uniform or variable depending on an amount of each type of spacer material used. For example, if the first spacer material 702 and the third spacer material 802 used are of differing amounts, then the pitch widths may be narrower than if a lower amount of the first spacer material 702 and the second spacer material 802 were used. Moreover, pitch widths 902 that were created by etching the initial substrate 102 may be five to ten angstroms. Each of the pitch widths 902 may be uniform and equidistant, or variable in length. For example, a first pitch width may be five angstroms, a second pitch width may be twenty angstroms, and a third pitch width may be forty angstroms, or any combination thereof.

Figure 10A:
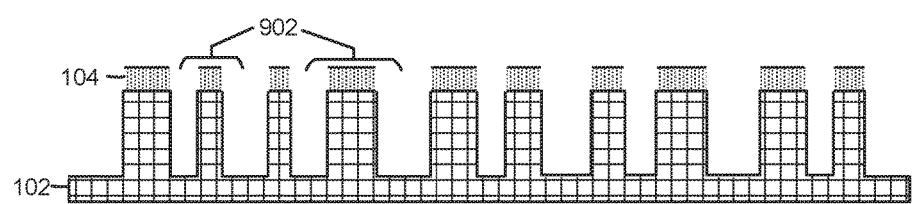
FIGS. 10A-10B illustrate a process for removing the first spacer material, the second spacer material, and the chemical material, in accordance with embodiments of the present disclosure.
Figure 10B:
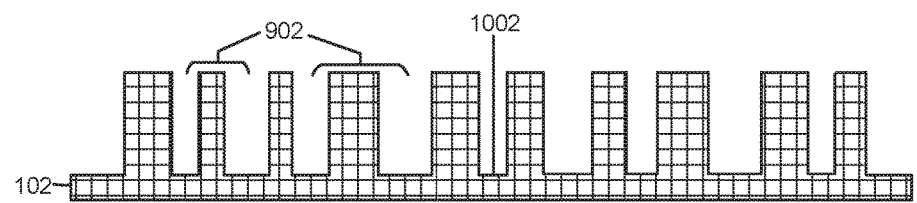

FIGS. 10A-10B illustrate the first chemical material 104, the first spacer material 702 and the second spacer material 802 being removed from the initial substrate 102, in accordance with embodiments of the present disclosure. As shown in FIG. 10A, the first spacer material 702 and the third spacer material 802 may be removed by performing reactive ion etching. In some embodiments, the first spacer material 702 and the third spacer material 802 may be etched by utilizing dilute hydrofluoric acid, or any wet chemistry technique that utilizes chemicals that are selective to remove the first spacer material 702 and the third spacer material 802. The reactive ion etching may be targeted so that a significant portion of the first spacer material 702 and the third spacer material 802 may be removed while leaving the first chemical material 104 or the initial substrate 102. In some embodiments, the reactive ion etching may be accomplished by spraying or pouring a chemical that reacts with the first spacer material 702 and the third spacer material 802 while not removing a substantial portion of the first chemical material 104 or the initial substrate 102.

As shown in FIG. 10B, the first chemical material 104 may be removed by performing reactive ion etching. In some embodiments, the first chemical material 104 may be etched by utilizing dilute hydrofluoric acid, or any wet chemistry technique that utilizes chemicals that are selective to remove the first chemical material 104. The reactive ion etching may be targeted so that a significant portion of the first chemical material 104 may be removed while leaving the initial substrate 102. In some embodiments, the reactive ion etching may be accomplished by spraying or pouring a chemical that reacts with the first chemical material 104 while not removing a substantial portion of the initial substrate 102. A pitch width 902, the distance from the center of a channel 1002 to the center of an adjacent channel, may be a variable length that depends on the quantity and type of material used for each of the spacer materials 702, 704, and 802. The pitch widths 902 may be variable, and the total amount of variable pitch widths 902 may be determined by the formula $C(N,m)=N!/(m!(N-m)!)$, where m is the number of spacers with different materials, N is the total number of spacers. The total can increase if a particular mandrel composition and a spacer gap etch are added. In some embodiments, the material, ordering, and deposition of the various chemical materials and spacer materials, and steps, are interchangeable and may be arranged in any order or permutation.

Chemicals/materials used (e.g., as spacers) in FIGS. 1A-10B are examples, that different chemicals/materials known to a person of ordinary skill in the art may be used, and that the order in which they are layered, as well as the number of layers added, may depend on the desired pitch widths/thicknesses, as well as the number and arrangement of desired pitches. Likewise, the spacer materials removed, if any, prior to etching the substrate may be based on the desired pitch characteristics (thickness, number, width, arrangement, etc.).

Figure 11:
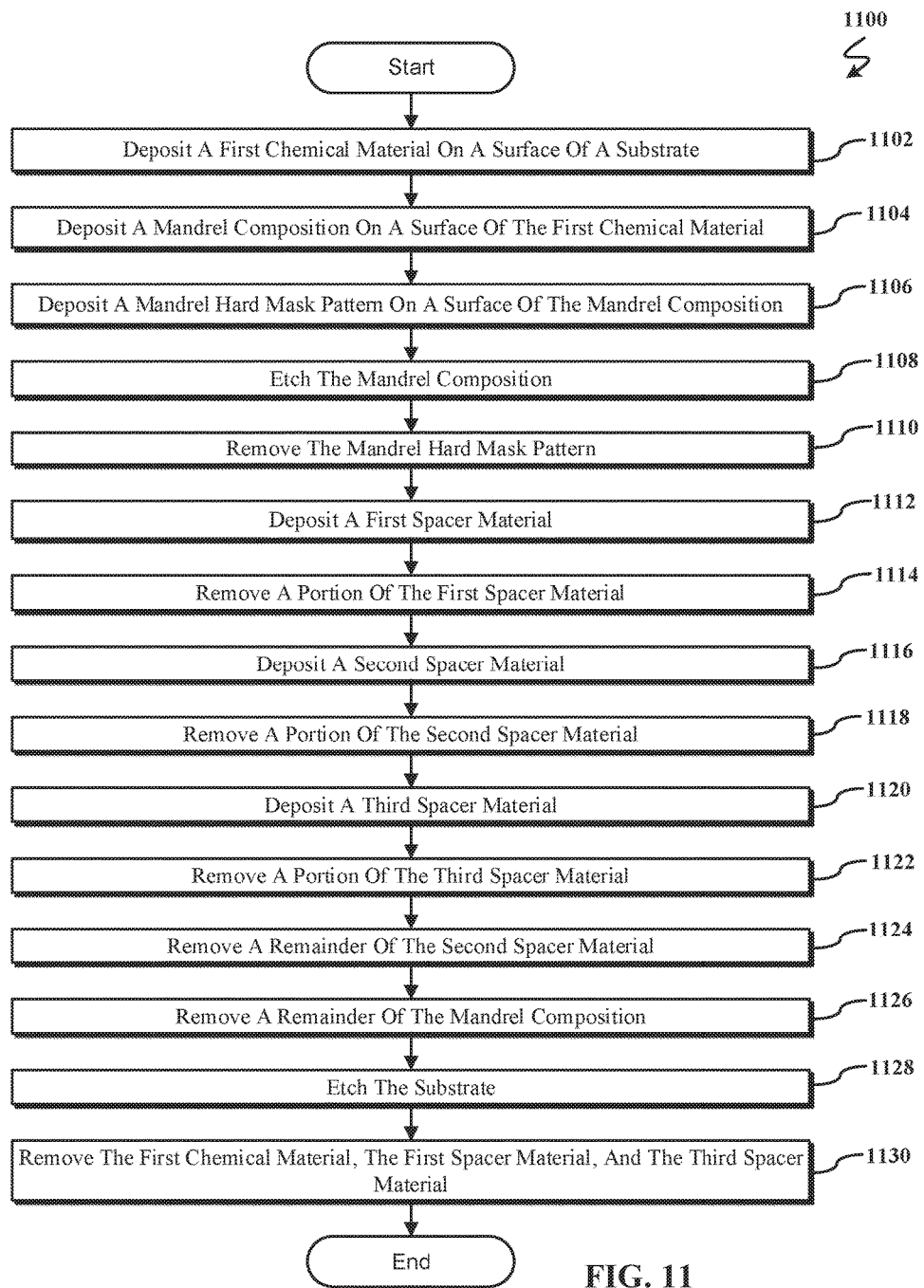
FIG. 11 illustrates an exemplary manufacturing process for manufacturing a structure, in accordance with embodiments of the present disclosure.

Referring now to FIG. 11, an operational flowchart illustrating an exemplary manufacturing process 1100, according to at least one embodiment is depicted. At 1102, a first chemical material is deposited on a surface of a substrate (e.g., as shown in FIG. 1B). The substrate may be a conductor, semiconductor, silicon, insulator, dielectric insulator films, or any type of material capable of carrying electrical signals. In some embodiments, the amount of chemical material deposited on the substrate may vary in order to control distances between the pitches, as well as the thickness of the pitches, as referenced herein. In some embodiments, the chemical material may be a titanium nitride, or any chemical material known to those skilled in the art to be capable of being hard masked onto the initial substrate. Additionally, the number of depositing steps dons can be used to vary the number, thickness, and width of the pitches.

At 1104, a mandrel composition is deposited on a surface of the first chemical material (e.g., as shown in FIG. 1C). In some embodiments, the mandrel composition may be amorphous silicon. At 1106, a mandrel hard mask pattern is deposited on a surface of the mandrel composition (e.g., as shown in FIG. 2A). The distance between adjacent mandrel hard masks, that may be multiple different masks deposited at the same time, or one mask with multiple features, may be that of a lithography-limited pitch, or any distance to achieve a desired distance between adjacent pitches. In some embodiments, the distance between adjacent mandrel hard masks may be equidistant or variable. Material used for the mandrel hard masks may be silicon nitride. At 1108, the mandrel composition is etched (e.g., as shown in FIG. 2B). In some embodiments, reactive ion etching may have been performed to etch the mandrel composition. At 1110, the mandrel hard mask pattern is removed (e.g., as shown in FIG. 2C). The mandrel hard mask pattern may be removed by utilizing dilute hydrofluoric acid. The dilute hydrofluoric acid may be selected so that the amorphous silicon and/or titanium nitride are not eaten away. The mandrel hard masks pattern may also be removed by atomic layer disposition.

At 1112, a first spacer material is deposited (e.g., as shown in FIGS. 3A and/or 7A). The first spacer material may be deposited on the mandrel composition and the first chemical material. The first spacer material may be any oxide, such as silicon dioxide. The deposition technique performed to deposit the first spacer material may be chemical vapor deposition. At 1114, a portion of the first spacer material is removed (e.g., as shown in FIGS. 3B and/or 7B). The first spacer material portion may be removed by reactive ion etching. At 1116, a second spacer material is deposited (e.g., as shown in FIGS. 3C and/or 7C). The second spacer material may have been deposited on the mandrel composition, the first chemical material, and a remaining portion of the first spacer material. The second spacer material may be any silicon nitride. The deposition technique of the second spacer material performed may be chemical vapor deposition. At 1118, a portion of the second spacer material is removed (e.g., as shown in FIGS. 4A and/or 8A). The second spacer material may be removed by reactive ion etching.

At 1120, a third spacer material is deposited (e.g., as shown in FIGS. 4B and/or 8B). The third spacer material may be deposited on the mandrel deposition, the first chemical material, and a remaining portion of the first spacer material, and a remaining portion of the second spacer material. The third spacer material may be any oxide, such as silicon dioxide. The type of material of the third spacer material may be substantially similar to the first spacer material or the second spacer material, or may be a different type of chemical material. The type may depend on whether the desired pitch width is uniform (i.e., the distance between adjacent pitches are equidistant), if the pitch width and distance between adjacent pitches are both variable, or some combination thereof. The deposition technique performed may be chemical vapor deposition. At 1122, a portion of the third spacer material is removed (e.g., as shown in FIGS. 4C and/or 8C). The third spacer material may be removed by performing reactive ion etching.

At 1124, a remainder of the second spacer material is removed (e.g., as shown in FIGS. 5A and/or 9A). The second spacer material may be removed by performing reactive ion etching, or by utilizing dilute hydrofluoric acid, or any wet chemistry technique utilizing chemicals that are selective to remove the second spacer material while leaving the first spacer and the third spacer. At 1126, a remainder of the mandrel composition is removed (e.g., as shown in FIGS. 5B and/or 9B). The remainder of the mandrel composition may be removed by performing reactive ion etching, or by utilizing dilute hydrofluoric acid, or any wet chemistry technique, utilizing chemicals that are selective to remove the remainder of the mandrel composition. In some embodiments, the chemicals removed may change depending on the desired pitch width and the distance between pitches. At 1128, the substrate is etched (e.g., as shown in FIGS. 5C and/or 9C). The substrate may have been removed by performing reactive ion etching using a chemical that does not affect the remaining spacer material(s).

At 1130, the first chemical material, the first spacer material, and the third spacer material are removed (e.g., as shown in FIGS. 6A, B and/or 10A, B). The first chemical material, the first spacer material, and the third spacer material may have been removed by performing reactive ion etching, or by utilizing dilute hydrofluoric acid, or any wet chemistry technique, utilizing chemicals that are selective to remove the first chemical material, the first spacer material, and the third spacer material. Once the first chemical material, the first spacer material, and the third spacer material are removed at 1130, the manufacturing process may conclude.

According to at least one embodiment, any number of spacers may be utilized; all the spacers may be different types of material, the same material, or some combination thereof. The spacers may be of a different quantity, depending on a desired width between adjacent pitches. The widths between adjacent pitches may be uniform and equivalent, may alternate between two numerical values or any number of numerical values, or every width distance may vary, or some combination thereof. The total amount of variable pitches may be determined by the formula $C(N,m)=N!/(m!(N-m)!)$, where m is the number of spacers with different materials, N is the total number of spacers. The total can increase if a selective mandrel composition and a spacer gap etch are added.

Aspects of the present disclosure include a product by the process as described in FIGS. 1-11. The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application, or technical improvement over technologies found in the marketplace, or to enable others of ordinary skill in the art to understand the embodiments disclosed herein.

What is claimed is:

1. A method, comprising:
   depositing a chemical material on a surface of a substrate;
   depositing a mandrel composition on a surface of the chemical material;
   depositing, without intervening etching, a mandrel hard mask pattern on a surface of the mandrel composition;
   etching the mandrel composition;
   removing the mandrel hard mask pattern;
   depositing a plurality of spacer materials on a surface of the chemical material and a surface of the mandrel composition;
   removing a portion of at least one of the plurality of spacer materials;
   removing a remainder of the mandrel composition;
   etching the substrate; and
   removing all of the chemical material and at least one of the spacer materials of the plurality of spacer materials;
   wherein the plurality of spacer materials comprises a first spacer material, a second spacer material, and a third spacer material, wherein the depositing of the plurality of spacer materials further comprises:
   depositing the first spacer material on the surface of the chemical material and the surface of the mandrel composition;
   depositing the second spacer material on a surface of the first spacer material, the surface of the chemical material, and the surface of the mandrel composition; and
   depositing the third spacer material on a surface of the second spacer material, the surface of the first spacer material, the surface of the chemical material, and the surface of the mandrel composition; and
   wherein the removing a portion of at least one of the plurality of spacer materials further comprises:
   removing, after depositing the first spacer material and prior to depositing the second spacer material, a portion of the first spacer material;
   removing, after depositing the second spacer material and prior to depositing the third spacer material, a portion of the second spacer material; and
   removing, sequentially, after depositing the third spacer material, a portion of the third spacer material, a remainder of the second spacer material, and a remainder of the mandrel composition.

2. The method of claim 1, wherein the first spacer material and the third spacer material are a same type of material.

3. The method of claim 1, wherein the first spacer material and the third spacer material are different types of material.

4. The method of claim 1, wherein the first spacer material, the second spacer material, and the third spacer material are deposited in different amounts.

5. The method of claim 1, wherein the depositing the mandrel hard mask pattern on the surface of the mandrel composition is such that the gaps between adjacent masks are substantially identical in size.

6. The method of claim 1, further comprising:
   depositing a fourth spacer material on a surface of the third spacer material, a surface of the second spacer material, a surface of the first spacer material, a surface of the chemical material, and a surface of the mandrel composition;
   removing a portion of the fourth spacer material;
   depositing a fifth spacer material on a surface of the third spacer material, a surface of the second spacer material, a surface of the first spacer material, a surface of the chemical material, and a surface of the mandrel composition;
   removing a portion of the fifth spacer material; and
   removing a remainder of the fourth spacer material and a remainder of the fifth spacer material.

7. The method of claim 6, wherein the first spacer material, the second spacer material, the third spacer material, the fourth spacer material, and the fifth spacer material are all different types of materials.

* * * * *